(12) United States Patent
Jansma et al.

(10) Patent No.: US 10,959,302 B2
(45) Date of Patent: Mar. 23, 2021

(54) UNIVERSAL POWER DISTRIBUTION UNIT, SYSTEMS AND METHODS INCLUDING USER SELECTABLE DYNAMIC COLOR ILLUMINATION

(71) Applicant: CIS GLOBAL LLC, Tucson, AZ (US)

(72) Inventors: Michael Kevin Jansma, Eureka, MO (US); Karl Klaus Dittus, Raleigh, NC (US); Yuanbing Li, Eureka, MO (US)

(73) Assignee: CIS GLOBAL LLC, Tuscon, AZ (US)

( * ) Notice: Subject to any disclaimer, the term of this patent is extended or adjusted under 35 U.S.C. 154(b) by 0 days.

(21) Appl. No.: 16/180,345

(22) Filed: Nov. 5, 2018

(65) Prior Publication Data

US 2020/0146118 A1    May 7, 2020

(51) Int. Cl.
*H05B 45/00*    (2020.01)
*H05K 7/14*    (2006.01)
*H05B 45/20*    (2020.01)

(52) U.S. Cl.
CPC .......... *H05B 45/20* (2020.01); *H05K 7/1492* (2013.01); *H05K 7/1494* (2013.01)

(58) Field of Classification Search
CPC .......................... H05B 33/08; H05B 33/0815; H05B 33/0842; H05B 33/0863; H05B 37/02; H05B 7/1492; H05B 7/1494; G08B 21/18; H01R 25/006; H01R 13/7175; H01R 24/76
See application file for complete search history.

(56) References Cited

U.S. PATENT DOCUMENTS

2016/0225246 A1*   8/2016   Huang ................. H01R 25/006
2019/0242562 A1*   8/2019   Chien ................. F21V 19/0015

* cited by examiner

*Primary Examiner* — Jimmy T Vu
(74) *Attorney, Agent, or Firm* — Armstrong Teasdale LLP

(57) ABSTRACT

A power distribution unit includes a housing, a plurality of power outlets disposed within the housing, and a dynamic illumination element operable in a user selected one of a plurality of distinct colors. Systems and methods of color coding input power paths to power distribution units are also described. The power distribution units are universally used in different color coded combinations with increased manufacturing and supply chain efficiencies, and simplified customer order processing.

20 Claims, 6 Drawing Sheets

UNIVERSAL POWER DISTRIBUTION UNIT, SYSTEMS AND METHODS INCLUDING USER SELECTABLE DYNAMIC COLOR ILLUMINATION

BACKGROUND OF THE INVENTION

The field of the invention relates generally to industrial power distribution units, and more specifically to multi-outlet power distribution units for computer server rack applications including data center computing equipment and devices powered by redundant power supplies.

Computer data center applications typically include a plurality of computer servers arranged in server racks or cabinets. Power distribution units (PDUs) include a number of power outlets distributed on a housing of the PDU for respective connection to components and equipment arranged on the server rack. The respective PDUs may receive power from the same power source or different power sources. Over a large number of server racks or cabinets housing large numbers of data center components, readily understanding the electrical connections made to the PDUs and various power sources feeding power to the PDUs presents practical challenges. Conventional PDUs are disadvantaged in some aspects from the manufacturer's perspective, and improvements are desired to more completely meet the needs of certain applications of PDUs.

BRIEF DESCRIPTION OF THE DRAWINGS

Non-limiting and non-exhaustive embodiments are described with reference to the following Figures, wherein like reference numerals refer to like parts throughout the various views unless otherwise specified.

DETAILED DESCRIPTION OF THE INVENTION

In order to understand the inventive concepts described below to their fullest extent, set forth below is a discussion of the state of the art and certain longstanding problems presented in certain data center applications that include industrial power distribution units (PDUs), followed by descriptions of exemplary inventive embodiments of PDU devices, systems and methods addressing the longstanding problems in the art. While described in the context of computer data centers and data center equipment, such description is exemplary only and the embodiments of the invention are not necessarily limited thereto. Rather, the benefits of the inventive embodiments accrue more generally to any application of PDUs that present similar problems or otherwise a desire to distinguish different PDUs from one another in a power system application.

The proper operation of a computer data center depends on highly reliable power distribution to ensure that the computing equipment is always powered on. In a typical data center, represented in the example of FIG. 1, redundant power input paths are sometimes provided in the electrical power distribution system 50 to increase system reliability for data center operation.

Figure 1:
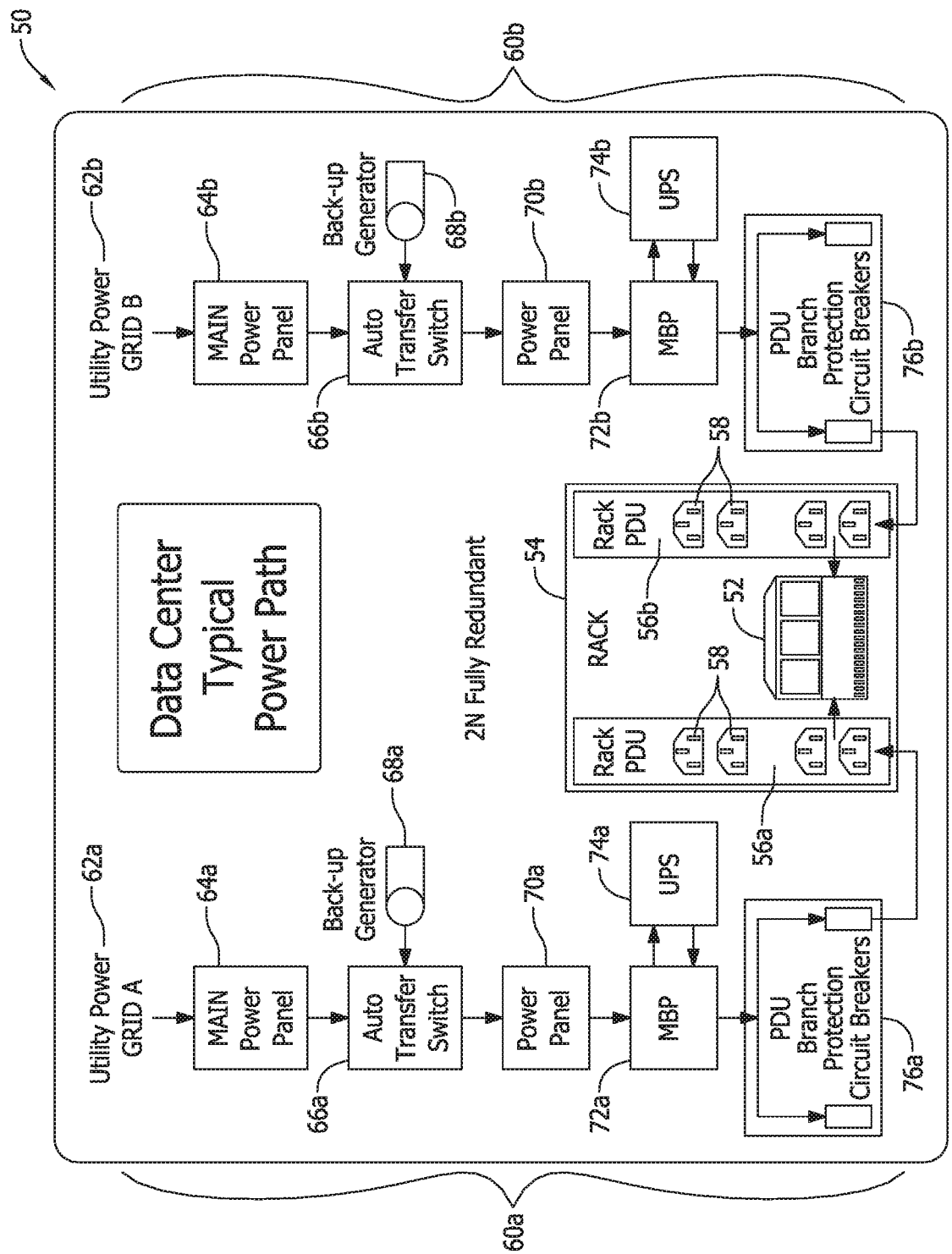
FIG. 1 is a schematic block diagram of an electrical power distribution system including a server rack and PDU arrangement for a data center application.

As shown in FIG. 1, information technology (IT) equipment 52 is typically assembled to and organized by an IT server cabinet or rack 54. Each piece of critical IT equipment 52 commonly includes dual power inputs which are connected to two different PDUs 56a and 56b within the server cabinet or rack. In turn, each PDU 56a and 56b includes a plurality of outlets 58 that respectively distribute electrical power to the various components of IT equipment 52 via removable power cords (not shown) extending between each PDU 56a or 56b and one of the dual power inputs of each component of the IT equipment 52 in the rack or cabinet 54. As such, via plug-in connections of the power cord for each component of IT equipment 52 connections may be established to the PDU 56a and to the PDU 56b that are, in turn, respectively connected to different power supplies for redundant power supply operation of the IT equipment 52 via different data center input power paths 60a or 60b. While one server rack 54 is shown including IT equipment 52, it is understood that many server racks 54 including PDUs 56a and 56b servicing IT equipment 52 may exist in a data center. Also, more than two input power paths may be implemented in the larger data center system to service the racks 54 and associated PDUs 56a and 56b.

Each PDU 56a and 56b is a type of industrial power strip that includes a main power input from a data center input power path 60a or 60b. Each power input path 60a, 60b includes power grid or power supply circuitry A or B (designated in FIG. 1 as 62a and 62b), main power panels 64a and 64b, transfer switches 66a and 66b, backup generators 68a and 68b, power panels 70a and 70b, Maintenance Bypass Panels (MBP) 72a and 72b, uninterruptible power supplies (UPS) 74a and 74b, and branch protection circuit breakers 76a and 76b feeding electrical power to the PDUs 56a and 56b and through the PDUs 56a and 56b to the IT equipment 52. The data center power paths 60a, 60b shown and described are exemplary only, and variations are possible to provide multiple and redundant power supply operation of the IT equipment 52 via the PDUs 56a and 56b.

In the case of an electrical fault condition or equipment failure, such redundant data center input power paths 60a and 60b ensure that power is not lost to critical Information Technology (IT) equipment 52 in the server rack 54. In contemplated embodiments, the IT equipment 52 includes computing equipment and computer devices (e.g., computer servers and hard disk drives) as well as other electronic devices (e.g., modems, routers, network switches, and telecommunications hardware) that is needed for data center operation. Of course, in such a redundant input power supply system arrangement it is beneficial to distinguish the respective connections to IT equipment 52 that connect to different power sources via the data center input power path 60a or 60b connected to each PDU 56a or 56b.

One conventional way to visually distinguish different power input path connections to the PDUs 56a and 56b is to paint the housing, sometimes referred to as a chassis, of each PDU 56a and 56b in different colors representing the different data center input power paths 60a or 60b. As one such example, RARITAN® brand PDUs (https://www.raritan.com) are available in number of different powder-coated, full color versions having different colors (e.g., black, red, blue, green, magenta, orange, yellow, white, brown, grey and light blue colors to easily distinguish different PDUs that are connected to different power sources by respectively different colors. As such, and for example, the PDU 56a may be powder-coated with a red color corresponding to the power path 60a, while the PDU 56b may be powder-coated with a blue color corresponding to the power path 60b. Color coding schemes are therefore possible allowing a person to visualize the different connections being made to different input power paths via differently colored PDUs.

Another conventional approach to visually distinguish different input power path connections to the PDUs 56a and 56b includes partial color-coding elements applied to the PDU housings such as paint in designated areas of the PDUs, adhesive labels or stickers, etc. Like the full color PDUs described above, this requires some customization of the PDUs 56a and 56b, either at the manufacturer level or the end user level. In the simple example above including red and blue color coding, two versions of the PDUs 56 are required in the respective colors to achieve the desired color coding.

Such conventional powder-coating, painting or labeling of PDUs, in itself, is not difficult or particularly costly, but from the perspective of a PDU manufacturer, such conventional color coding of PDUs is nonetheless problematic because there is no industry standard for the colors to be used. As such, PDUs are requested in a wide variety of colors by customers, introducing a number of challenges to the manufacturer to efficiently meet customer demand.

Specifically, accommodating a large variety of different colors requested by different customers in a conventional manner as described above complicates the PDU manufacturer's supply chain by requiring access to a large number of different colors of powder-coating, paint, or adhesive labels in the manufacturing stage, while also resulting in heavy inventory and carrying costs to stock an adequate number of PDUs that are powder-coated, painted or otherwise decorated in various different colors desired by customers to achieve color coding objectives. Considering the example above wherein conventional PDUs may be provided in black, red, blue, green, magenta, orange, yellow, white, brown, grey and light blue powder-coated colors, the potential inventory issues are believed to be self-evident to ensure that customer orders may quickly be filled with PDUs in stock for each color made available.

A possible solution to such inventory issues is to build the PDUs in specific colors in a conventional manner, but do so on demand as customer orders are received. This often requires some delay in fulfilling orders, however, and in certain cases a relatively long lead time is needed in order to build PDUs provided in special colors (i.e., colors that are not represented in standardized manufacturing inventory supplies) that may be requested by certain customers. Especially over a large number of PDUs being manufactured for a large number of customers, such supply chain complexities adds undesirable costs and/or undesirable delay in fulfilling PDU orders in certain colors. The supply chain complexities also introduce opportunities for human error in making orders and fulfilling orders via relatively complicated and easily confused part numbers when ordering differently colored PDUs at the customer level, or supplying the PDUs at the distributor level or the manufacturing level, any of which may result in receipt of a PDU of the wrong color by the customer. Such errors tend to frustrate customers and introduce additional costs to manufacturers and distributors associated with product returns and exchanges.

In view of the above, lower cost solutions and increased manufacturing efficiencies are desired for PDUs having desirable color-coding features, while simplifying product order processes and enhancing customer satisfaction.

Figure 2:
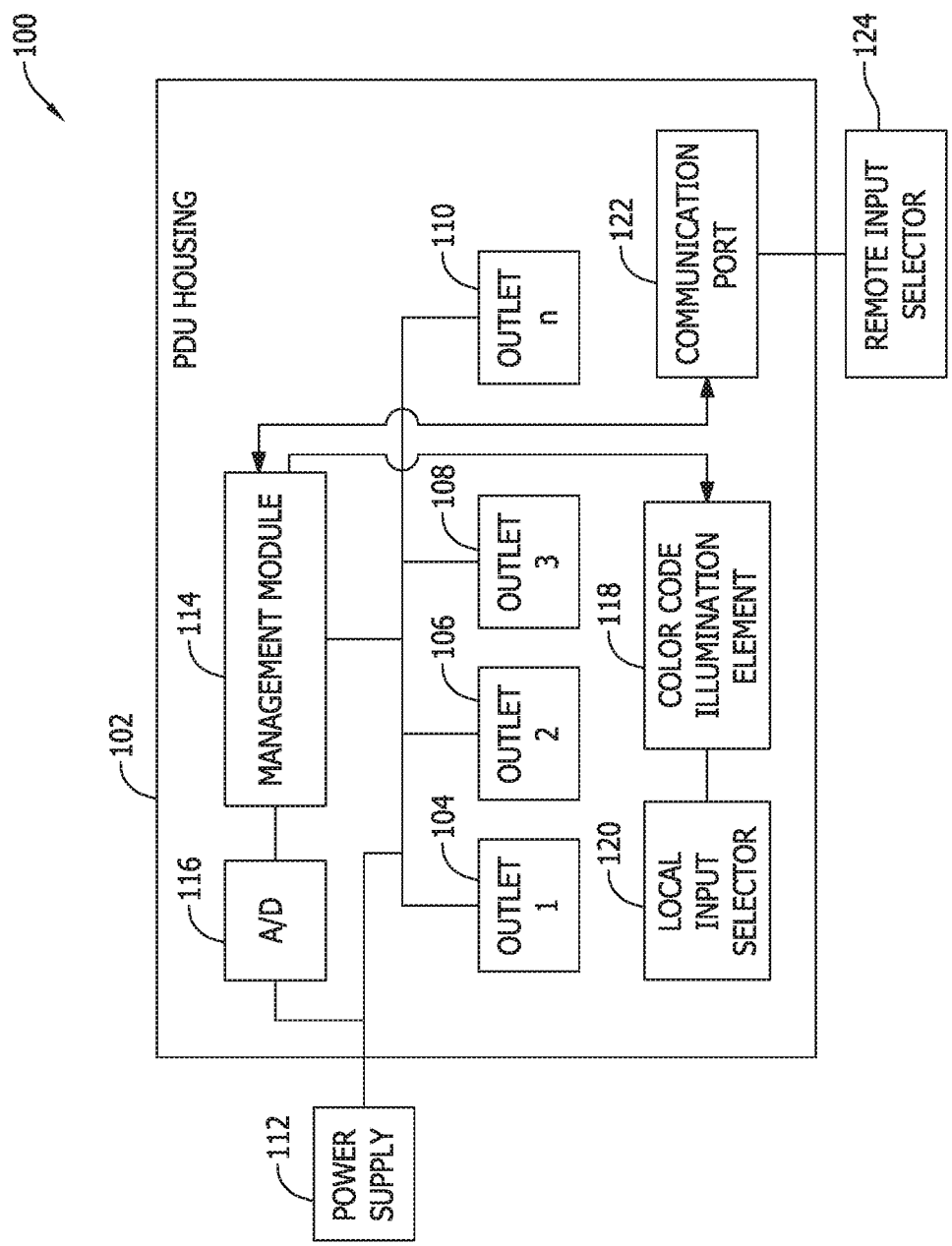
FIG. 2 is a schematic block diagram of an exemplary embodiment of a universal PDU device including a dynamic color code illumination element for the server rack and data center application shown in FIG. 1.

FIG. 2 is a schematic block diagram of an exemplary embodiment of a PDU 100 according to the invention that overcomes the issues described above. The PDU 100 provides universal color coding capabilities and vastly improved manufacturer supply chain considerations and distribution channels. The PDU 100 may be interchangeably utilized as either one of the PDUs 56a or 56b in the system 50 arranged as shown in FIG. 1. That is, the PDU 100 may exhibit red color coding, blue color coding, and/or other colors to meet a variety of color needs in a single PDU device via dynamic illumination features described below that are operable to impart different visual appearances of the PDU 100, without utilizing the conventional color coding approaches described above and without incurring the associated drawbacks of conventional color coding approaches.

The PDU 100 includes a housing or chassis 102 and a number n of power outlets 104, 106, 108 and 110. The housing 102 may be fabricated from either metal or plastic, and any number n of power outlets may be included in any desired location or orientation within the housing 102. As shown in the examples further below, two banks of twelve outlets each may be provided at spaced apart locations on the housing 102, although numerous variations are possible in this regard. Each outlet receives electrical power from an input power supply 112 that may correspond to either of the power input paths 60a or 60b shown in FIG. 1.

An optional management module 114, described further below, is provided in the housing 102 and is in communication with one or more of the power outlets 104, 106, 108 and 110. An analog to digital (A/D) power converter 116 receives power from the input power supply 112 and outputs power to the management module 114.

Unlike the conventional color coding techniques described above that are static (i.e., constant and unchanging) in appearance, the PDU 100 includes a dynamic color code illumination element 118 that is operable to emit light in one of a plurality of user selectable colors to achieve color coding of different power path inputs to the PDU 100.

For example, and following the scenario above, in the conventional approach two different PDUs are required that respectively include static color coding of red and blue, respectively, to achieve the color coding desired. The customer must therefore order, and the manufacturer must supply, otherwise similar PDUs that are customized with the static red or blue colors desired. In contrast, by virtue of the dynamic illumination feature of the PDU 100, two identical PDUs 100 (i.e., the same version of PDU) could be provided and dynamically used as either one of the PDU 56a in FIG. 1 to produce a red lighting effect or as the PDU 56b in FIG. 1 to produce a blue lighting effect. As such, while two PDUs 100 are still required in the system 50, they can be ordered and supplied in the same version while still realizing the color coordination desired, and with the end user selectively controlling the color illumination for each of the PDUs 100 in the larger system. The colors emitted by the dynamic color code illumination element 118 may be selected by the end user via a local input selector 120 on the housing 102, or via a communication port 122 and a remote input selector 124. While one illumination element 118 is shown, more than one illumination element 118 may be provided.

Following the two color red/blue example above, the PDU 100 that may dynamically produce both colors via the illumination element 118 reduces the supply chain burdens by ½ compared to conventional approaches that require two versions of static red and blue PDUs. Of course, the benefits grow as the number of colors is expanded. In the example of ten colors that can all be realized in the PDU 100, the supply chain burdens are 1/10 of those introduced via conventional approaches requiring ten versions of static PDUs in the colors desired. The single PDU 100 being capable of realizing multiple and distinct color coding via the illumination element 118 further avoids order processing complications of conventional static PDU color coding and possible human error in ordering and supplying static color coded PDUs in the correct color.

In contemplated embodiments, the local input selector 120 may be a multiple position switch that can be operated by a user to display a different one of possible colors emitted by the same or different dynamic color code illumination elements 118 as further described below. For example, the dynamic color code illumination element(s) 118 may initially be off and accordingly do not emit any light. The off condition may constitute a first visual color coded appearance of the PDU 100.

When a user first depresses the switch, the illumination element(s) 118 are energized and operative to emit a light in a first color (e.g., red) that is distinct in appearance from the off position and constitutes a second visual color coded appearance of the PDU 100.

When a user again depresses the switch, the illumination element(s) 118 may be energized and operative to emit a light in a second color (e.g., blue) that is distinguishable from the red colored light and constitutes a third visual color coded appearance of the PDU 100.

Additional and different colors (e.g., green, yellow, white, etc.) may be emitted by the illumination element(s) 118 with each subsequent press of the switch, and after cycling through all possible colors the dynamic illumination element(s) 118 may be de-energized and accordingly once again do not emit any light.

While an exemplary local input selector 120 is described, it is understood that other local input selectors besides multi-position switches are possible and may be appropriately utilized with similar effect allowing the end user to select a desired one of the possible illuminated colors for the PDU 100. The input selector 120 may in some cases be provided as part of the management module 114, and in other cases may be provided separately from the management module 114. Also, more than one local input selector 120 may be provided to operate different types of illumination elements in different portions of the housing 102.

As demonstrated in the following examples, the illumination element(s) 118 may be implemented in a segment or section of a multi-color electronic display screen, as one or more lighting elements that are operable in different modes to emit different colored light (e.g., red/green/blue (RGB) light emitting diodes (LEDs)), or via different lighting elements each respectively providing a single color that are selectively illuminated to achieve desired color coding objectives. Especially for multi-color electronic display screens and RGB LEDs used in combination with one another, the possible dynamic color selections are for practical purposes unlimited. Compared to conventional approaches, the color coding is realized via dynamic operation of the illumination element(s) 118 rather than by static elements applied to the PDU housing. The housing 102 of the PDU 100 may be provided in a single, static color via painting, power-coating, labels and the like, while the illumination elements 118 universally provide dynamically distinct color appearances chosen by the end user. The supply chain complexities discussed above are therefore avoided, and manufacturing efficiencies are improved via a single (stockkeeping unit) SKU for the PDU 100. Specifically, conventional inventories of different static colored powder-coatings, paints and labels are avoided, and so are any delays of obtaining powder-coatings, paints and labels that are not in current inventory.

In addition to or in lieu of the local input selector 120, remote color selection may be made by an end user via the communication port 122 and a connected device 124. In contemplated embodiments, the device 124 may be a computer device connected via cable to the communication port 120, and the end user may select a color (e.g., red, blue, green, yellow, white or any other color selection that may be realized) via a web-enabled user interface including, for example, a menu of selectable colors that may be emitted by the illumination elements 118 of the PDU 100. Variations are of course possible regarding user input of desired color from a remote location, and communication between the PDU and a remote end user may be achieved via wireless communication as desired. Various types of communication ports and communication protocols for remote selection and operation of the dynamic color code illumination element 118 are known and may be utilized. Combinations of different dynamic color code illumination elements are likewise possible that may be locally and/or remotely selected.

As another significant benefit, and unlike conventional static colored PDUs, the PDU 100 facilitates reconfiguration of the color coding and/or versatile use of the PDU 100 to be used in different locations in the same data center system in a manner that conventional approaches do not afford. For example, two PDUs 100 can be used in the system 50 described above with red and blue color illumination, and at any time desired the PDUs 100 can easily be changed to other color coded combinations such as green and yellow by simply re-selecting the colors illuminated by each PDU 100. In the conventional approach, the static red and blue PDUs would need to be replaced with yellow and green PDUs to accomplish the yellow and green color coding.

As another example, an existing PDU 100 in the data center system may be moved from a first location in the data center where the red color coding is appropriate to a second location in the data center where a color other than red is appropriate (e.g., yellow). As such, the PDUs 100 may be moved from rack to rack to facilitate reconfiguration of a data center that static colored PDUs generally preclude. The PDU 100 may be more or less universally and interchangeably used wherever desired in the system 50 as the colors emitted may be dynamically changed to meet the needs of their specific points of installation.

Figure 3:
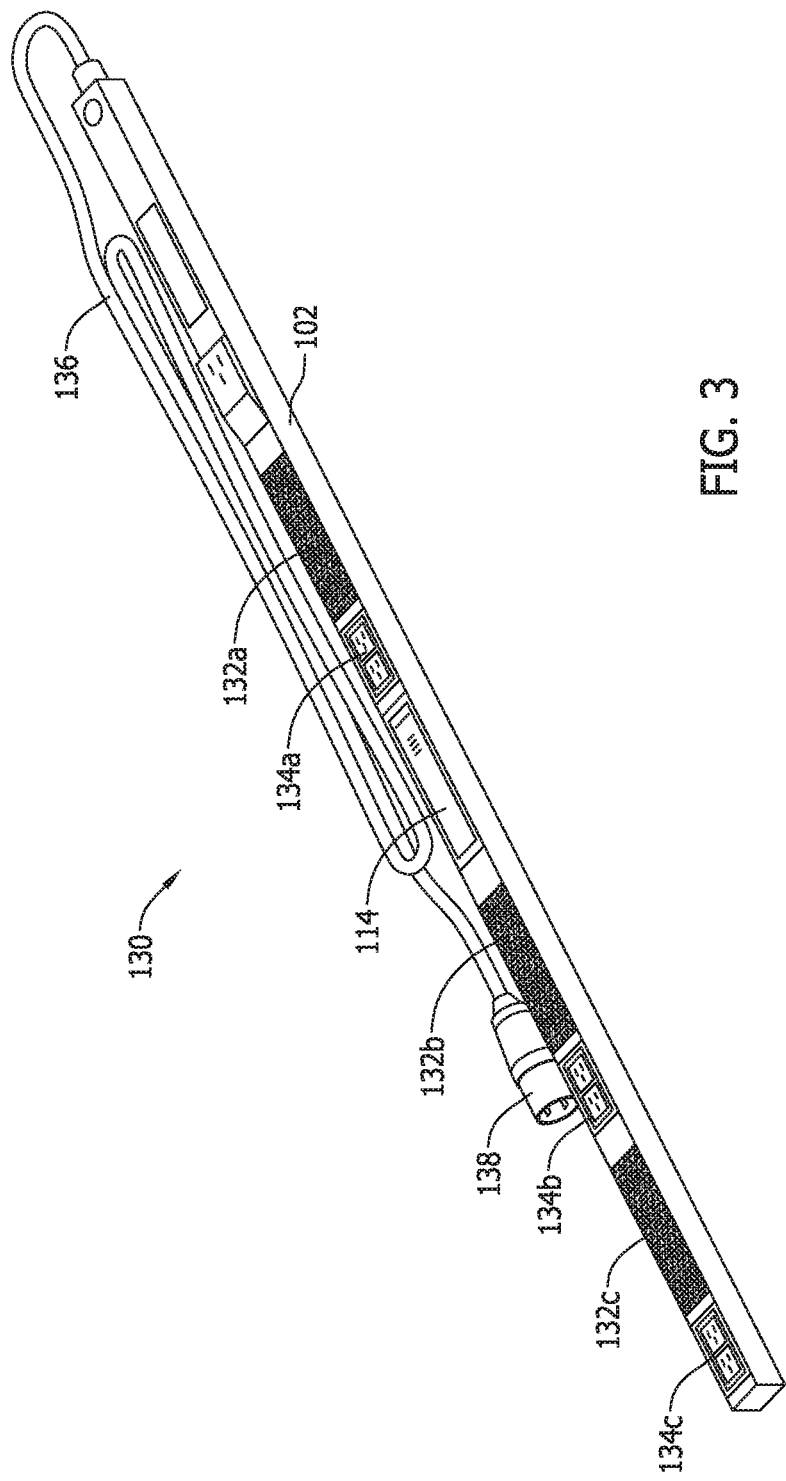
FIG. 3 is a perspective view of an exemplary embodiment of a PDU device that implements the dynamic color code illumination element shown in FIG. 2.

FIG. 3 is a perspective view of an exemplary embodiment of a PDU device 130 that implements the dynamic color code illumination element shown in FIG. 2. The PDU 130 is shown with an elongated, slim profile housing 102, and forty power outlets arranged in three banks of outlets 132a, 132b, 132c including twelve power outlets each at spaced apart locations in the housing 102, and three pairs of power outlets 134a, 134b, 134c at spaced apart locations in the housing 102 adjacent the banks of outlets 132a, 132b, 132c. The outlets in the banks 132a, 132b, 132c are of a different type than the outlets in the bank 134a, 134b, 134c as shown. The management module 114 is shown to be centrally located in the housing 102 between the outlet bank 134a and the outlet bank 132b, although other locations are possible. The PDU 130 includes a power cord 136 and plug connector 138 to make a connection with a power input path as described above. Once the power input connection is made, the PDU 100 distributes power via any of the outlets provided to IT equipment 52 or to other electrical devices and loads as desired. While an exemplary PDU configuration is shown and described, considerable variations are possible concerning the number of outlets, types of outlets, relative arrangements of outlets to one another, etc.

Figure 4:
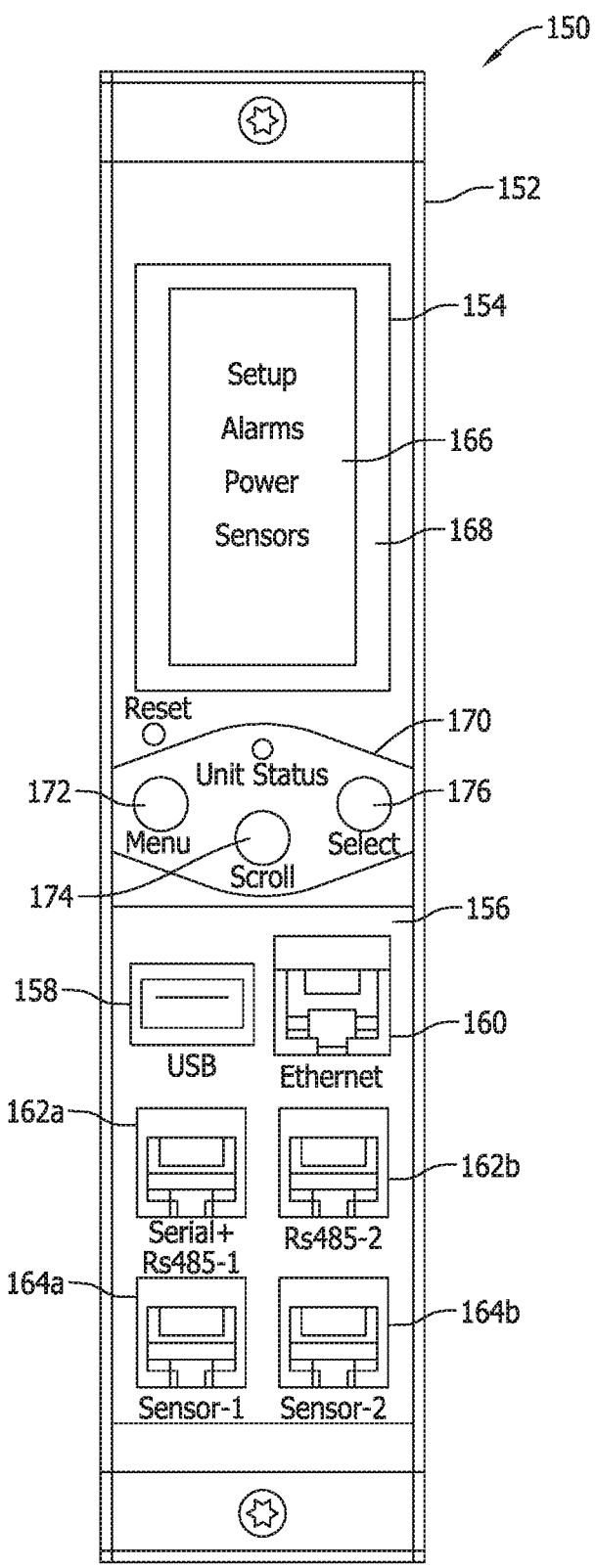
FIG. 4 is a top plan view of an exemplary management module including a display for the PDU device shown in FIG. 3.

FIG. 4 is a top plan view of an exemplary management module 150 that may be used as the module 114 in the PDU 130 shown in FIG. 3. The management module 150 includes a housing 152 and a display 154 that implements the dynamic color code illumination 118 described above.

The PDU 130 may be provided with "intelligent" features such as power metering, power control, environmental sensing, etc. of the PDU 130 in use. The management module 150, sometimes referred to as a network management module, includes a simple computer or controller in communication with a network interface 156 to realize bi-directional communication with a remote computer or computing network for purposes of monitoring and managing the power system in the data center. A number of different communication ports are shown in the network interface 156, including a Universal Serial Bus (USB) port 158, an Ethernet port 160, two Rs485 ports 162a and 162b, and two sensor ports 164a and 164b. Connections made be made to the respective ports 158, 160, 162 and 164 via mating cables and connectors in a known manner. Any of the ports may serve as the communication port 122 shown in FIG. 2 for purposes of color illumination selection by a user via a remote input selector 124.

The display 154 is local to the management module 150 to show data and setup at the PDU 130 to the end user or installer, as well as responsible persons for overseeing the data center. The display 154 in the management module 150 may include a liquid crystal display (LCD) display screen, a light emitting diode (LED) display screen, and LCD/LED display screen, an organic light emitting diode (oLED) display screen, or another known type of display screen capable of functioning as described herein. The local display 154 may be a single color display or multiple color display, may be provided with or without backlighting, and is factory set to show critical power and setup information to the end user, installer or overseer.

In the example shown, the display 154 includes a center section 166 and a border section 168. A display interface 170 is provided below the display 154 and in the example shown includes input selectors 172, 174 and 176 for the end user to select menu, scroll and select inputs in an interactive manner with the display 154, and specifically the center section 154 thereof. As seen in FIG. 4, the user may navigate through Setup, Alarms, Power and Sensor menus with the interface 170.

In certain contemplated embodiments, the center section 166 may include a large segment LED fixed display including phase and circuit breaker bank current values when the Power selection is made via the display 154. In contemplated embodiments, the display 154 may support any number of circuit breakers (e.g., 18 circuit breakers), although variations are possible.

The display 154 of the management module 150 also includes five alarm indicator icons in the illustrated example when the Alarms section is made. The alarm indicators include a power problem icon, a cascade (daisy chain) problem icon, an environmental alarm icon, a physical security alarm, and a circuit breaker tripped icon. The relatively large border section 166 may also serve as a flashing border alarm indicator to draw particular attention to the PDU from distance away.

In a contemplated embodiment, the display 154 may be a 1.3" User Interactive oLED display including a 3-button user interface control as shown, multi-language character support, and auto-dimming for reduced power consumption and longer life.

One or more sections 166 and 168 of the display 154 may be utilized to implement the illumination feature 118 described above. For example, a user defined color code border section 168 of the display 154 may be utilized to provide color coded power input source path identification as discussed above. Using one of the buttons on the interface 170, or via a remote device as described above, the user may select one of a plurality of distinct colors for the display border section 168. For example, the user may select a red border, a blue border, or a border of any other available color. The user selectable red border, blue border, or other color border emitted by the display 154 universally achieves a variety of different color coding combinations to connections made the PDU with designated input power paths. While the illustrated embodiment includes the entire border section of the display illuminated with the desired color, in another embodiment only a portion of the display border may be illuminated with otherwise similar effect.

For a backlit display 154, the backlighting in the center section 166 can also be used to emit light of a selected color by the end user in the backlit section of the display for color coding purposes, either separately or in combination with the color border section 168 to achieve further variation in color coding possibilities. For example, red or blue backlighting, or backlighting of another color, would likewise universally achieve a variety of different color coding combinations in the same SKU of the PDU 100. In certain embodiments, both a display border section 168 and a backlit center section 166 could be illuminated in the same or different colors (or in different shades of the same color) to achieve still further visual effects.

In view of the above, the display 154 of the management module 150 provides a very inexpensive and universal method to allow end users to locally customize the colors displayed (via selected colors for illumination) and therefor color code their PDU sources in the system 50 shown in FIG. 1 or in other applications. Supply chain complexity is considerably reduced. One part number (i.e., a single SKU) can be manufactured and ordered by customers, while providing end use capability to accommodate different color coding combinations chosen by the end user.

While the display 154 has been described in the context of the exemplary management module 150, other configurations of management modules are possible. Also, in another contemplated embodiment a similar display may be provided elsewhere in the PDU 100 for color coding purposes only. The management module 150 is therefore not required in all embodiments to achieve the dynamic color coding illumination.

Figure 5:
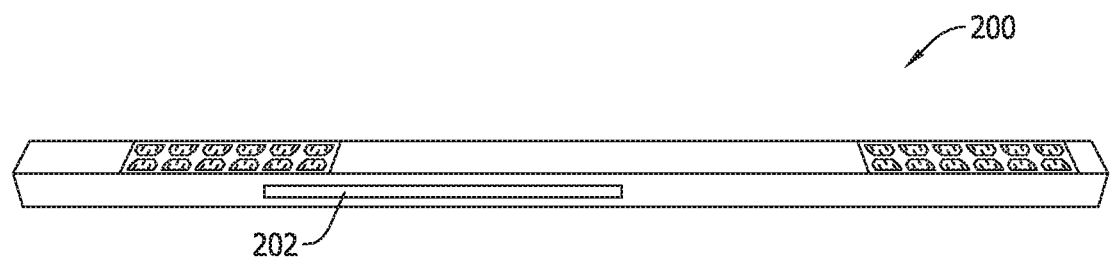
FIG. 5 is a side perspective view of a first alternative exemplary embodiment of a PDU device that implements the dynamic color code illumination element shown in FIG. 2 with a lighting element and a light distributing element that is separate and independent from a management module.

FIG. 5 is a side perspective view of a first alternative exemplary embodiment of a PDU 200 that implements the dynamic color code illumination element 118 shown in FIG. 2 with a lighting element and a light distributing element 202 that is separate and independent from a management module 150 as described above. The light distributing element 202 may be a light pipe that distributes light from a multi-color LED or a single color LED beneath the light distributing element 202. Combinations of LEDs, as well as other types of light sources, are possible that may illuminated to emit lights of different colors that can be spread by the light distributing element 202 to a larger surface area. In the example shown, the light distributing element 202 extends as a long, thin element on the sides of the PDU housing. When illuminated, the light distributing element 202 may glow in the selected color (e.g., red, blue or other color). The benefits are similar to those described above, and the dynamic illumination elements of FIG. 5 may be provided separately or in combination with those described in relation to FIG. 4 and the display 154.

Figure 6:
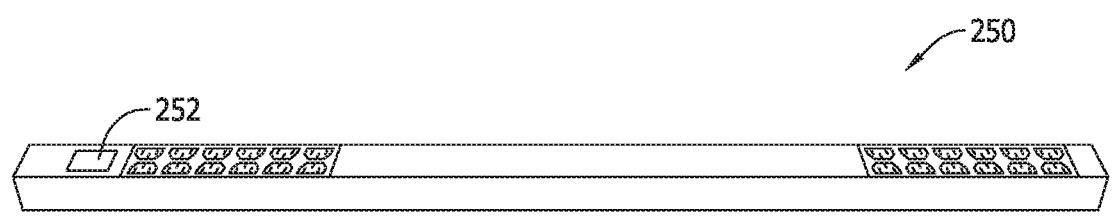
FIG. 6 is a side perspective view of a second alternative exemplary embodiment of a PDU device that implements the dynamic color code illumination element shown in FIG. 2 via a lighting element at spaced location from the management module.

FIG. 6 is a side perspective view of a second alternative exemplary embodiment of a PDU 250 that implements the dynamic color code illumination element 114 shown in FIG. 2 via a lighting element 252 at a spaced location from a management module such as that described in FIG. 2 or FIG. 3. The lighting element 252 is provided on the top of the PDU housing and may include one or more LEDs or other lighting elements that may be illuminated to glow in the selected color (e.g., red, blue or other color). The benefits are similar to those described above, and the dynamic illumination elements of FIG. 6 may be provided separately or in combination with those described in relation to FIG. 5 or FIG. 4.

Figure 7:
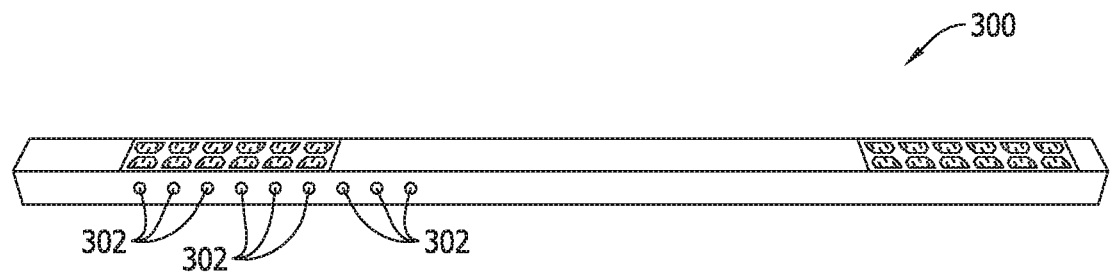
FIG. 7 is a side perspective view of a third alternative exemplary of a PDU device that implements the dynamic color code illumination element shown in FIG. 2 via a series of distributed lighting elements.

FIG. 7 is a side perspective view of a third alternative exemplary of a PDU 300 that implements the dynamic color code illumination element 118 shown in FIG. 2 via a series of distributed lighting elements 302 along the sides of the PDU housing. The lighting elements 302 may be multi-color LEDs that may be operated in different modes to emit different colors as selected (e.g., red, green, blue) or in single colors only. In the single color light element scenario, less than all of the lighting elements 302 provided will be illuminated after the selected color is chosen. For example, when the color red is chosen, only the red lighting elements will be lit, when the color green is chosen only the green lighting elements will be lit, and when the blue color is chosen only the blue lighting elements will be lit. The benefits are similar to those described above, and the dynamic illumination elements of FIG. 7 may be provided separately or in combination with those described in relation to FIG. 6, FIG. 5, or FIG. 4.

Figure 8:
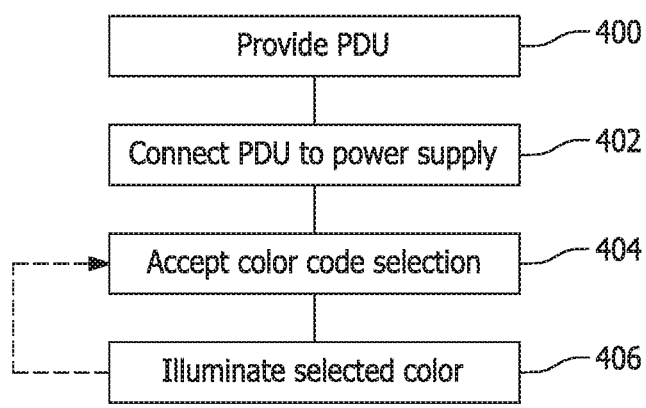
FIG. 8 is a method flowchart of an exemplary process of dynamic color illumination for the PDU devices illustrated in FIGS. 2 through 6.

FIG. 8 is a method flowchart of an exemplary process of dynamic color illumination for the PDUs illustrated in FIGS. 2 through 7.

At step 400, one or more of the universal PDUs with dynamic illuminations is provided. The PDUs may include the PDU 100 as implemented more specifically in the exemplary PDU devices 130, 150, 200, 250 and 300 described above.

At step 402, the PDUs provided at step 400 are attached to the server racks or cabinets and connections are made to the desired power paths as described above in the system 50.

At step 404, color selections are accepted from users via either of the remote input selector or the remote input selectors described above for the desired power distribution units.

At step 406, the dynamic illumination element(s) are illuminated in accordance with the accepted colors at step 404. The selected colors will continuously be illuminated, and at any point desired an end user may locally or remotely change the color of illumination.

The steps 400, 402, 404, 406 may be repeated for any number of power distribution units to color code or color coordinate the connections in a power system, including but not necessarily limited to the power system for the data center application described above. Further, the method does not necessarily require server racks or cabinets for its implementation, although the benefits are particularly well suited for server racks in data centers.

The benefits and advantages of the invention are now believed to have been amply illustrated in relation to the exemplary embodiments disclosed.

A power distribution unit has been disclosed including a housing, a plurality of power outlets disposed within the housing, and a dynamic illumination element operable in a user selected one of a plurality of distinct colors.

Optionally, the power distribution unit may also include a display screen. The dynamic illumination element may be implemented in a section of the display screen. The power distribution unit may include a management module within the housing, and the management module may include the display screen. The dynamic illumination element may likewise be implemented separately from the display screen.

As further options, the dynamic illumination element may include at least one light emitting diode element operable in different modes to display the user selected one of the plurality of distinct colors. The dynamic illumination element may include a plurality of lighting elements respectively operable to produce only one of the plurality of distinct colors A communication port configured to establish communication with a remote device to receive the user selected one of the plurality of distinct colors may be provided. At least one local input selector to receive the user selected one of the distinct colors may also be provided.

The dynamic illumination element may likewise be distributed along a side of the housing. The dynamic illumination element may also include a light dispersing light pipe.

An embodiment of a power distribution system has also been disclosed including first and second power distribution units. Each of the first and second power distribution units includes a housing, a plurality of power outlets disposed within the housing, a dynamic illumination element operable in a user selected one of a plurality of distinct colors, and at least one of a local or remote input selector for accepting the user selected one of the plurality of distinct colors. Each of the first and second power distribution units connects to a different power path and a different power supply, and the dynamic illumination elements in each of the first and second power distribution units are operated in different ones of the plurality of distinct colors to visually color code the power path connections being made to each of the first and second power distribution units.

As system options, the dynamic illumination element may be implemented in a section of a display screen. The dynamic illumination element may also be implemented with at least one lighting element and a light pipe. The dynamic illumination element may be implemented with a combination of lighting elements. The combination of lighting elements may include light elements that produce only a single color. The system may be provided in combination with a server rack or cabinet defining a portion of a data center.

A method of color coding a plurality of power input path connections to a plurality of power distribution units in a power distribution system has also been disclosed. Each of the plurality of power distribution units includes a housing, a plurality of power outlets disposed within the housing, and a dynamic illumination element operable in a user selected one of a plurality of distinct colors. The method includes connecting each of the plurality of power distribution units to one of the plurality of input power paths; accepting a color code selection for each of the plurality of power distribution units to visually designate the connected input power path; and illuminating the dynamic illumination element in each of the plurality of power distribution units in accordance with the accepted color code selection.

As method options, accepting a color code selection for each of the plurality of power distribution units may include accepting a color code selection via at least one local input selector of at least one of the plurality of power distribution units. Accepting a color code selection for each of the plurality of power distribution units may also include accepting a color code selection via at least one remote input selector of at least one of the plurality of power distribution units.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power distribution unit comprising:
   a housing;
   a plurality of power outlets disposed within the housing and being operable to distribute power from any one of a plurality of redundant power input paths; and
   a dynamic illumination element operable in a user selected one of a plurality of distinct colors, whereby the user selected one of the plurality of distinct colors visually distinguishes a connected one of the plurality of redundant power input paths from the other of the plurality of redundant power input paths.

2. The power distribution unit of claim 1, further comprising a display screen.

3. The power distribution unit of claim 2, wherein the dynamic illumination element is implemented in a section of the display screen.

4. The power distribution unit of claim 3, further comprising a management module within the housing, the management module including the display screen.

5. The power distribution unit of claim 2, wherein the dynamic illumination element is implemented separately from the display screen.

6. The power distribution unit of claim 1, wherein the dynamic illumination element comprises at least one light emitting diode element operable in different modes to display the user selected one of the plurality of distinct colors.

7. The power distribution unit of claim 1, wherein the dynamic illumination element comprises a plurality of lighting elements respectively operable to produce only one of the plurality of distinct colors.

8. The power distribution unit of claim 1, further comprising a communication port configured to establish communication with a remote device to receive the user selected one of the plurality of distinct colors.

9. The power distribution unit of claim 1, further comprising at least one local input selector to receive the user selected one of the plurality of distinct colors.

10. The power distribution unit of claim 1, wherein the dynamic illumination element is distributed along a side of the housing.

11. The power distribution unit of claim 1, wherein the dynamic illumination element further comprises a light dispersing light pipe.

12. A power distribution system comprising:
    first and second power distribution units each comprising:
      a housing;
      a plurality of power outlets disposed within the housing;
      a dynamic illumination element operable in a user selected one of a plurality of distinct colors; and
      at least one of a local or remote input selector for accepting the user selected one of the plurality of distinct colors;
    wherein each of the first and second power distribution units connects to a different power input path and a different power supply; and
    wherein the dynamic illumination elements in each of the first and second power distribution units are operated in different ones of the plurality of distinct colors to visually color code the different power path connections being made to each of the first and second power distribution units.

13. The system of claim 12, wherein the dynamic illumination element is implemented in a section of a display screen.

14. The system of claim 12, wherein the dynamic illumination element is implemented with at least one lighting element and a light pipe.

15. The system of claim 12, wherein the dynamic illumination element is implemented with a combination of lighting elements.

16. The system of claim 15, wherein the combination of lighting elements includes light elements that produce only a single color.

17. The system of claim 12, in combination with a server rack or cabinet defining a portion of a data center.

18. A method of color coding a plurality of input power path connections to a plurality of power distribution units in an electrical power distribution system, each of the plurality of power distribution units including a housing, a plurality of power outlets disposed within the housing, and a dynamic illumination element operable in a user selected one of a plurality of distinct colors; wherein the plurality of power distribution units are connected to a different one of the plurality of input power paths, the method comprising:
    accepting a color code selection for each of the plurality of power distribution units to visually designate the connected input power path; and
    illuminating the dynamic illumination element in each of the plurality of power distribution units in accordance with the accepted color code selection.

19. The method of claim 18, wherein accepting the color code selection for each of the plurality of power distribution units comprises accepting a color code selection via at least one local input selector of at least one of the plurality of power distribution units.

20. The method of claim 18, wherein accepting the color code selection for each of the plurality of power distribution units comprises accepting a color code selection via at least one remote input selector of at least one of the plurality of power distribution units.

* * * * *